United States Patent
Hocevar

(10) Patent No.: US 7,581,159 B2
(45) Date of Patent: Aug. 25, 2009

(54) SIMPLIFIED DECODING USING STRUCTURED AND PUNCTURED LDPC CODES

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 778 days.

(21) Appl. No.: 11/284,929

(22) Filed: Nov. 22, 2005

(65) Prior Publication Data

US 2006/0123277 A1    Jun. 8, 2006

Related U.S. Application Data

(60) Provisional application No. 60/630,454, filed on Nov. 23, 2004, provisional application No. 60/643,079, filed on Jan. 11, 2005.

(51) Int. Cl.
   H03M 13/03    (2006.01)
(52) U.S. Cl. .................... 714/790; 714/758
(58) Field of Classification Search ............. 714/790, 714/758
   See application file for complete search history.

(56) References Cited

U.S. PATENT DOCUMENTS

| | | | |
|---|---|---|---|
| 6,539,367 B1 | 3/2003 | Blanksby et al. | |
| 6,633,856 B2 * | 10/2003 | Richardson et al. | 706/15 |
| 6,789,227 B2 * | 9/2004 | De Souza et al. | 714/804 |
| 6,895,547 B2 * | 5/2005 | Eleftheriou et al. | 714/801 |
| 2002/0051501 A1 * | 5/2002 | Demjanenko et al. | 375/298 |
| 2003/0033575 A1 | 2/2003 | Richardson et al. | |
| 2003/0043487 A1 | 3/2003 | Morita et al. | |
| 2003/0065989 A1 | 4/2003 | Yedida et al. | |
| 2003/0104788 A1 | 6/2003 | Kim | |
| 2004/0034828 A1 | 2/2004 | Hocevar | |
| 2004/0098659 A1 * | 5/2004 | Bjerke et al. | 714/776 |
| 2004/0148560 A1 | 7/2004 | Hocevar | |
| 2004/0194007 A1 | 9/2004 | Hocevar | |
| 2005/0149845 A1 * | 7/2005 | Shin et al. | 714/801 |
| 2005/0283707 A1 * | 12/2005 | Sharon et al. | 714/758 |

OTHER PUBLICATIONS

Gallager, Low-Density Parity-Check Codes, (MIT Press, 1963).

Mackey et al.,"Comparison of Constructions of Irregular Gallager Codes",Trans.Comm.,vol. 47,No. 10 (IEEE,Oct. 1999),pp. 1449-1454.

(Continued)

*Primary Examiner*—M. Mujtaba K Chaudry
(74) *Attorney, Agent, or Firm*—Steven A. Shaw; W. James Brady; Frederick J. Telecky, Jr.

(57) ABSTRACT

A communications transceiver for transmitting and receiving coded communications, with the coding corresponding to a low-density parity check code, is disclosed. A set of available code word lengths and code rates are to be supported by the transceiver. These available code word lengths and code rates are implemented as a subset of starting code word lengths, which are length-reduced by shortening and puncturing selected bit positions in the starting code word length to attain the desired one of the available code word lengths and code rates. The bit positions to be shortened and punctured are selected in a manner that avoids interference between the shortened and punctured bit positions, and that attains excellent code performance.

18 Claims, 6 Drawing Sheets

OTHER PUBLICATIONS

Tanner et al.,"A Class of Group-Structured LDPC Codes", ISTCA-2001 Proc. (Ambleside,England, 2001).

Richardson et al.,"Efficient Encoding of Low-Density Parity-Check Codes", IEEE Trans.on Information Theory, vol. 47,No. 2(Feb. 2001),pp. 638-656.

Blankenship et al.,"Motorola Harmonized Structured LDPC Proposal" (Motorola, Aug. 13, 2004).

Hocevar,"LDPC Code Construction with Flexible Hardware Implementation",Proc.IEEE ICC (IEEE,May 2003),pp. 2708-2712.

Stolpman,"Irregular Structured LDPC Codes",Submission IEEE C802.16e-04-264 (IEEE 802.16 Broadband Wireless Access Working Group, Aug. 17, 2004).

Classon et al.,"LDPC coding for OFDMA PHY",Submission IEEE C802.16e-05/006 (IEEE 802.16 Broadband Wireless Access Working Group, Jan. 10, 2005).

Classon et al.,"LDPC coding for OFDMA PHY",Submission IEEE C802.16e-05/006r2 (IEEE 802.16 Broadband Wireless Access Working Group, Jan. 25, 2005).

Joo et al, "Optional B-LDPC coding for OFDMA PHY", Submission IEEE 802.16e-04-78 to IEEE 802.16 Broadband Wireless Access Working Group of the IEEE 802 LAN/MAN Standards Committee (May 10, 2004).

Classon et al.,"Low-complexity LDPC coding for OFDMA PHY", Submission IEEE C802.16e-04/101 to IEEE 802.16 Broadband Wireless Access Working Group of the IEEE 802 LAN/MAN Standards Committee (May 15, 2004).

Marks, "IEEE Standard 802.16: A Technical Overview of the WirelessMAN Air Interface for Broadband Wireless Access", Submission IEEE C802.16-02-05 to IEEE 802.16 Broadband Wireless Access Working Group of the IEEE 802 LAN/MAN Standards Committee (Jun. 4, 2002).

Zhang et al.,"VLSI Implementation-Oriented (3,k)-Regular Low-Density Parity-Check Codes", IEEE Workshop on Signal Processing Systems (Sep. 2001), pp. 25-36.

* cited by examiner

FIG. 3

| | $H_p$ | | | | | | | | | | | | $H_i$ | | | | | | | | | | | |
|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 1  | 1 |   |   |   |   |   | 1 |   |   |   |   |   |    | 1 |    |    | 1 |    |    |    | 1 | 1 | 1 |   |
| 2  |   | 1 |   |   |   |   |   |   |   |   |   |   | 1  |   |    | 1  |   |    |    | 1 |   | 1 | 1 | 1 |
| 3  |   |   | 1 |   |   | 1 |   |   |   |   |   |   |    | 1 |    |    | 1 |    |    | 1 |   |   | 1 | 1 |
| 4  |   |   |   | 1 |   |   |   | 1 |   |   |   |   |    |   | 1  |    |   | 1  |    |   |   | 1 | 1 | 1 |
| 5  |   |   |   |   | 1 |   |   | 1 |   |   |   |   |    |   | 1  |    |   | 1  |    |   |   | 1 | 1 | 1 |
| 6  |   |   |   |   |   | 1 |   |   | 1 | 1 |   |   |    |   |    |    |   | 1  |    |   | 1 | 1 | 1 |   |
| 7  | 1 |   |   |   |   |   |   |   | 1 |   |   |   | 1  |   |    |    |   | 1  |    |   |   | 1 | 1 | 1 |
| 8  |   | 1 |   |   |   |   | 1 |   |   |   |   |   |    | 1 |    |    |   |    | 1  |   | 1 | 1 | 1 |   |
| 9  |   |   | 1 |   |   |   |   | 1 |   |   | 1 |   |    |   | 1  |    |   |    |    | 1 |   | 1 | 1 | 1 |
| 10 |   |   |   | 1 |   |   |   |   | 1 |   |   |   | 1  |   | 1  |    |   |    |    |   |   | 1 | 1 | 1 |
| 11 |   |   |   |   | 1 |   |   |   |   | 1 |   |   |    |   | 1  |    | 1 |    |    |   |   |   | 1 | 1 |
| 12 |   |   |   |   |   | 1 |   |   |   |   | 1 |   |    | 1 |    |    |   | 1  |    |   |   | 1 | 1 | 1 |

$H_m$

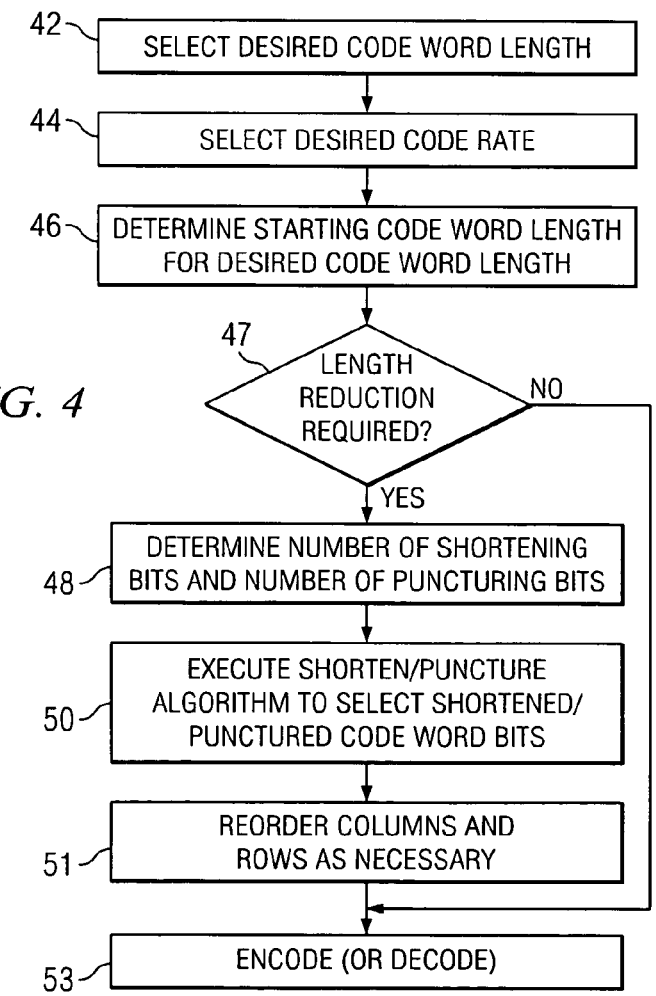

FIG. 4

42 — SELECT DESIRED CODE WORD LENGTH

44 — SELECT DESIRED CODE RATE

46 — DETERMINE STARTING CODE WORD LENGTH FOR DESIRED CODE WORD LENGTH

47 — LENGTH REDUCTION REQUIRED? — NO

YES

48 — DETERMINE NUMBER OF SHORTENING BITS AND NUMBER OF PUNCTURING BITS

50 — EXECUTE SHORTEN/PUNCTURE ALGORITHM TO SELECT SHORTENED/ PUNCTURED CODE WORD BITS

51 — REORDER COLUMNS AND ROWS AS NECESSARY

53 — ENCODE (OR DECODE)

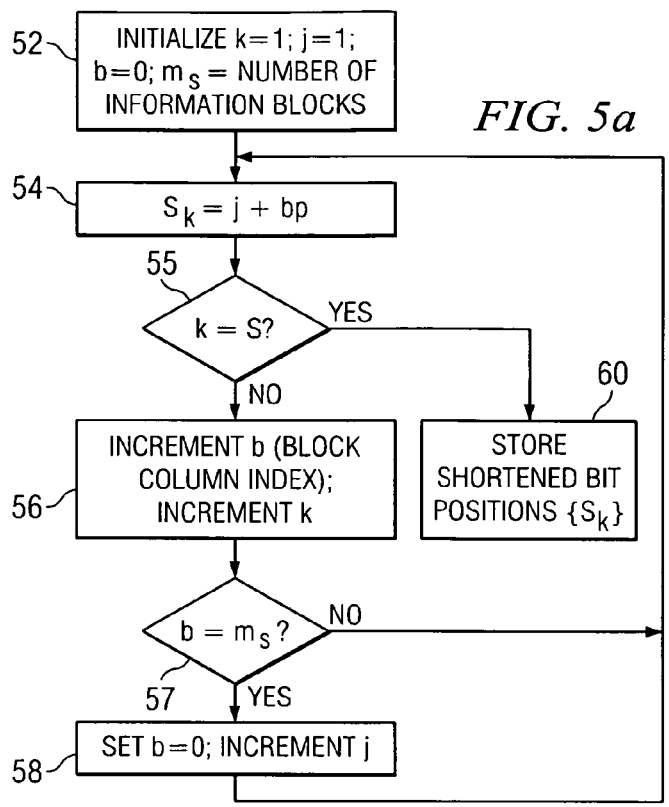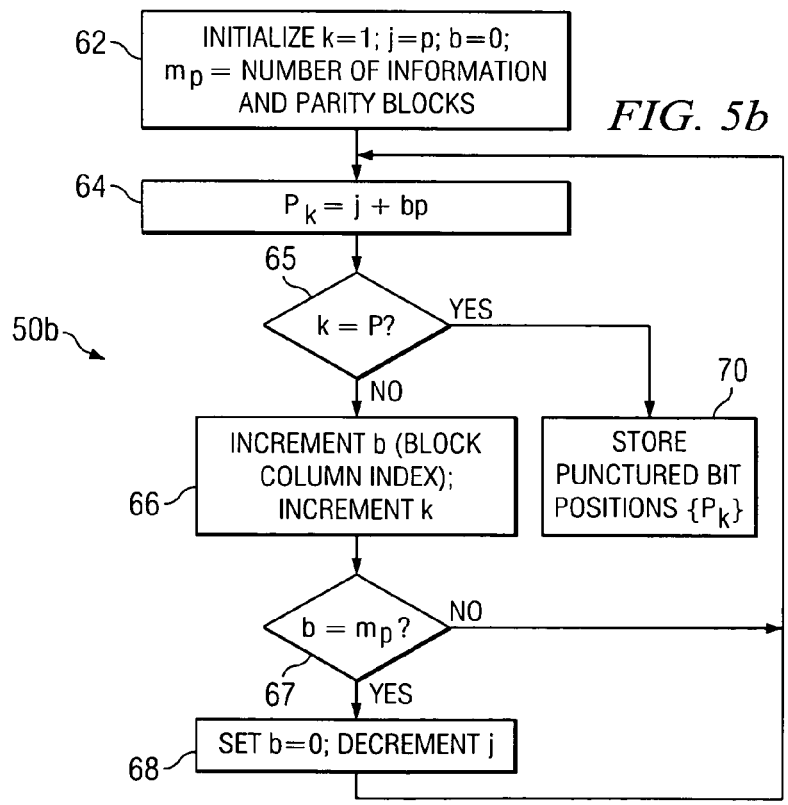

SIMPLIFIED DECODING USING STRUCTURED AND PUNCTURED LDPC CODES

CROSS-REFERENCE TO RELATED APPLICATIONS

This application claims priority, under 35 U.S.C. §119(e), of Provisional Application No. 60/630,454, filed Nov. 23, 2004, and of Provisional Application No. 60/643,079, filed Jan. 11, 2005, both of which are incorporated herein by this reference.

STATEMENT REGARDING FEDERALLY SPONSORED RESEARCH OR DEVELOPMENT

Not applicable.

BACKGROUND OF THE INVENTION

This invention is in the field of data communications, and is more specifically directed to redundant coding for error detection and correction in such communications.

High-speed data communication services, for example in providing high-speed Internet access, have become a widespread utility for many businesses, schools, and homes. In its current stage of development, this access is provided by an array of technologies. Some data communication approaches use existing telephone lines, with relatively slow data rates provided by voice band modems (e.g., according to the current v.92 communications standards), and higher data rates provided by Digital Subscriber Line (DSL) technology. Another current technology involves the use of cable modems communicating over coaxial cable, often in combination with cable television services. The Integrated Services Digital Network (ISDN) is a system of digital phone connections over which data is transmitted simultaneously across the world using end-to-end digital connectivity. Localized wireless network connectivity according to the IEEE 802.11 standard has become popular for connecting computer workstations and portable computers to a local area network (LAN), and typically through the LAN to the Internet. Broadband wireless data communication technologies, for example those technologies referred to as "WiMAX" and "WiBro", and those technologies according to the IEEE 802.16d/e standards, are now being developed to provide wireless DSL-like connectivity in the Metro Area Network (MAN) and Wide Area Network (WAN) context.

A problem that is common to all data communications technologies is the corruption of data by noise. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol as received differs from the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Error detection and correction techniques are typically implemented by the technique of redundant coding. In general, redundant coding inserts data bits into the transmitted data stream that do not add any additional information, but that indicate, on decoding, whether an error is present in the received data stream. More complex codes provide the ability to deduce the true transmitted data from a received data stream even if errors are present.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood exists that two of three bits are in error, resulting in an erroneous majority vote despite the useful data rate having been reduced to one-third. More efficient approaches, such as Hamming codes, have been developed toward the goal of reducing the error rate while maximizing the data rate.

The well-known Shannon limit provides a theoretical bound on the optimization of decoder error as a function of data rate. The Shannon limit provides a metric against which codes can be compared, both in the absolute and relative to one another. Since the time of the Shannon proof, modern data correction codes have been developed to more closely approach the theoretical limit. An important class of these conventional codes includes "turbo" codes, which encode the data stream by applying two convolutional encoders. One of these convolutional encoders encodes the datastream as given, while the other encodes a pseudo-randomly interleaved version of the data stream. The results from the two encoders are interwoven to produce the encoded data stream.

Another class of known redundant codes are the Low Density Parity Check (LDPC) codes. The fundamental paper describing these codes is Gallager, *Low-Density Parity-Check Codes*, (MIT Press, 1963), monograph available at http://www.inference.phy.cam.ac.uk/mackay/gallager/papers/. In these codes, a sparse matrix H defines the code, with the encodings c of the payload data satisfying:

$$Hc=0 \qquad (1)$$

over Galois field GF(2). Each encoding c consists of the source message $c_i$ combined with the corresponding parity check bits $c_p$ for that source message $c_i$. The encodings c are transmitted, with the receiving network element receiving a signal vector r=c+n, n being the noise added by the channel. Because the decoder at the receiver also knows matrix H, it can compute a vector z=Hr. However, because r=c+n, and because Hc=0:

$$z=Hr=Hc+Hn=Hn \qquad (2)$$

The decoding process thus involves finding the most sparse vector x that satisfies:

$$Hx=z \qquad (3)$$

over GF(2). This vector x becomes the best guess for noise vector n, which can be subtracted from the received signal vector r to recover encodings c, from which the original source message $c_i$ is recoverable.

There are many known implementations of LDPC codes. Some of these LDPC codes have been described as providing code performance that approaches the Shannon limit, as described in MacKay et al., "Comparison of Constructions of Irregular Gallager Codes", *Trans. Comm.*, Vol. 47, No. 10

(IEEE, October 1999), pp. 1449-54, and in Tanner et al., "A Class of Group-Structured LDPC Codes", *ISTCA*-2001 *Proc.* (Ambleside, England, 2001).

In theory, the encoding of data words according to an LDPC code is straightforward. Given enough memory or small enough data words, one can store all possible code words in a lookup table, and look up the code word in the table according to the data word to be transmitted. But modern data words to be encoded are on the order of 1 kbits and larger, rendering lookup tables prohibitively large and cumbersome. Accordingly, algorithms have been developed that derive codewords, in real time, from the data words to be transmitted. A straightforward approach for generating a codeword is to consider the n-bit codeword vector c in its systematic form, having a data or information portion $c_i$ and an m-bit parity portion $c_p$ such that $c=(c_i|c_p)$. Similarly, parity matrix H is placed into a systematic form $H_{sys}$, preferably in a lower triangular form for the m parity bits. In this conventional encoder, the information portion $c_i$ is filled with n-m information bits, and the m parity bits are derived by back-substitution with the systematic parity matrix $H_{sys}$. This approach is described in Richardson and Urbanke, "Efficient Encoding of Low-Density Parity-Check Codes", *IEEE Trans. on Information Theory*, Vol. 47, No. 2 (February 2001), pp. 638-656. This article indicates that, through matrix manipulation, the encoding of LDPC codewords can be accomplished in a number of operations that approaches a linear relationship with the size n of the codewords. However, the computational efficiency in this and other conventional LDPC encoding techniques does not necessarily translate into an efficient encoder hardware architecture. Specifically, these and other conventional encoder architectures are inefficient because they typically involve the storing of inverse matrices, by way of which the parity check of equation (1), or a corollary, is solved in the encoding operation.

By way of further background, my copending patent application Ser. No. 10/329,597, filed Dec. 26, 2002, now published as U.S. Patent Publication No. US 2004/0034828, and my copending patent application Ser. No. 10/806,879, filed Mar. 23, 2004, and now published as U.S. Patent Publication No. US 2004/0194007 A1, both commonly assigned herewith and incorporated herein by this reference, describe a family of structured irregular LDPC codes, and decoding architectures for those codes. The quasi-cyclic structure of this family of LDPC codes can also provide efficiencies in the hardware implementation of the encoder, as described in my copending patent application Ser. No. 10/724,280, filed Nov. 28, 2003, now published as U.S. Patent Publication No. US 2004/0148560 A1, commonly assigned herewith and incorporated herein by this reference. The encoder and encoding method that are described in U.S. Patent Publication No. US 2004/0148560 A1 follow a generalized approach, and are capable of handling such complications as row rank deficiency.

By way of still further background, my copending patent application Ser. No. 11/201,391, filed Aug. 10, 2005, commonly assigned herewith and incorporated herein by this reference, describes constraints on this family of structured irregular LDPC codes that enable recursive, and efficient, encoding of communications.

By way of further background, as fundamental in the coding art, the "code rate" of a particular code is a unit of measure corresponding to the number of information bits contained within a code word. Specifically, as typically used in the art, the code rate is the ratio of the number of information bits within a transmitted code word to the total number of bits transmitted within the code word (i.e., information bits plus parity bits, for systematic codes). For example, a code rate of 1:2, or 1/2, refers to a code word in which one-half of its bits are information bits, and the other one-half of the bits are parity bits. A code rate of 2:3 thus has one-half as many parity bits as information bits. As such, the closer that the code rate approaches a 1:1 ratio, the higher the effective information data rate, all other parameters being equal. Uncoded transmissions are thus at a code rate of 1:1, because no parity bits are transmitted.

The use of "length-reduced" code words is known in the art. In general, a "length-reduced" code word involves eliminating bits of the code word, as transmitted, from the full length of the code word as encoded. One known approach for reducing the code word length is by way of "puncturing" of the code word. In this approach, certain bits of the code word are simply not transmitted in the code word. In decoding the transmitted punctured code word, the missing bits are reconstructed in the decoding process from the transmitted bits of the code word, as a result of the "correction" properties of the coding. The receiver, of course, must know which bits of the code word were punctured, in order to accurately retrieve the information. Puncturing may be constrained to the parity bits of the systematic code word; however, information bits may also be punctured if desired. In general, puncturing increases the code rate of the transmission, at a cost of code performance (i.e., higher error rate for a given SNR, or higher SNR being required for a given error rate).

Another approach for length reduction is referred to in the art as "shortening". According to this approach, which is applied to systematic codes, a selected number of information bits is forced to a known state (e.g., "0"), and therefore need not be transmitted. A full complement of parity bits must be generated from the information bits including the forced-value bits, however, in order for the coding to be effective, and of course the receiver must be aware of which information bits are not transmitted (and their forced state, of course). The use of "shortening" techniques is useful in situations in which the code (and code word length) is constrained to a certain length, but in which the available transmission word length is shorter than the length of the information portion of the full code word, or in which the number of necessary information bits is less than that available for the code word. Code "shortening" results in a reduction in the overall code rate, however, considering that the same number of information bits and total bits are not transmitted in the shortened code word (in the code rate ratio, both the numerator and the denominator are reduced by the same absolute value). Shortening tends to improve the performance of the code, however, because there is less overall uncertainty in the full code word after shortening is reversed in the receiver (i.e., the state of the shortened bits is known with certainty).

By way of further background, many known communications standards specify particular coding approaches, including specific codes, and specific code word lengths. For example, the code set for the IEEE 802.16d/e standards for "WiMAX" and "WiBro" broadband wireless data communication technologies, specifies nineteen available code word lengths, each of which may be encoded at any of three code rates. Transmissions according to the standards may be carried out using any one of those code word lengths, at any of the three code rates. The decoding circuitry for receiving such communications must contemplate any of the nineteen code word lengths, at any of the three code rates, in order to fully meet the standard. In this example, therefore, fifty-seven codes must be contemplated in the decoder hardware.

BRIEF SUMMARY OF THE INVENTION

It is therefore an object of this invention to provide apparatus and methods for coding and decoding transmissions in which a subset of available codes can be extended to cover a specified larger number of code choices.

It is a further object of this invention to provide such apparatus and methods in which the code rates can be precisely selected.

It is a further object of this invention to provide such apparatus and methods in which both puncturing and shortening can be applied to a code word without interference between one another.

Other objects and advantages of this invention will be apparent to those of ordinary skill in the art having reference to the following specification together with its drawings.

The present invention may be implemented into a communications system in which code words of one code word length are length-reduced, by shortening, puncturing, or a combination of both, to form code words of another specified code word length. More specifically, this invention can be implemented into such a communications system in which transmissions are to be carried out according to one of a specified set of code word lengths and code rates, but in which only a subset of the code word lengths is present. Shortening and puncturing techniques are applied to one of the subset code word lengths to arrive at another one of the specified code word lengths and code rates.

According to another aspect of this invention, algorithms are provided by way of which a code word is both punctured and shortened in a manner that maintains excellent performance, and in which interference from puncturing and shortening the same code word bit is avoided.

BRIEF DESCRIPTION OF THE SEVERAL VIEWS OF THE DRAWING

FIG. 3 is an illustration of an example of a macro parity check matrix representation of an LDPC code suitable for use in connection with the preferred embodiment of the invention.

FIG. 4 is a flow diagram illustrating the operation of the preferred embodiments of the invention in implementing code word sizes and code rates based on a subset of available code word sizes.

FIGS. 5a and 5b are flow diagrams illustrating the selection of shortening bits and puncturing bits, respectively, in the operation of FIG. 4 according to a first preferred embodiment of the invention.

DETAILED DESCRIPTION OF THE INVENTION

The present invention will be described in connection with an example of its implementation in an exemplary transceiver, for example a wireless broadband network adapter such as according to the IEEE 802.16 wireless broadband standards. It will be apparent to those skilled in the art having reference to this specification that this invention is particularly well-suited for use in such an application. However, it is also contemplated that this invention will be of similar benefit in many other applications that involve error correction coding, including other types of communications and different media, including other wireless communications such as wireless telephony, and wireless Local Area Network (LAN) communications, such as contemplated according to the IEEE 802.11 a/b/g/n standards; this invention is also contemplated to be beneficial for error correction coding in wired data communications such as involved in conventional Digital Subscriber Line (DSL) broadband communications, cable modem broadband access, wired LAN communications, and even data communications within a single computer system (e.g., error correction as applied to disk drive access). In the communications context, this invention can be used in communications carried out using a wide range of modulation techniques, including single-carrier modulation, and multi-carrier modulation approaches such as orthogonal frequency division multiplexing (OFDM) and discrete multitone modulation (DMT). It is therefore to be understood that these and other alternatives to and variations on the embodiment described below are contemplated to be within the scope of this invention as claimed.

Figure 1:
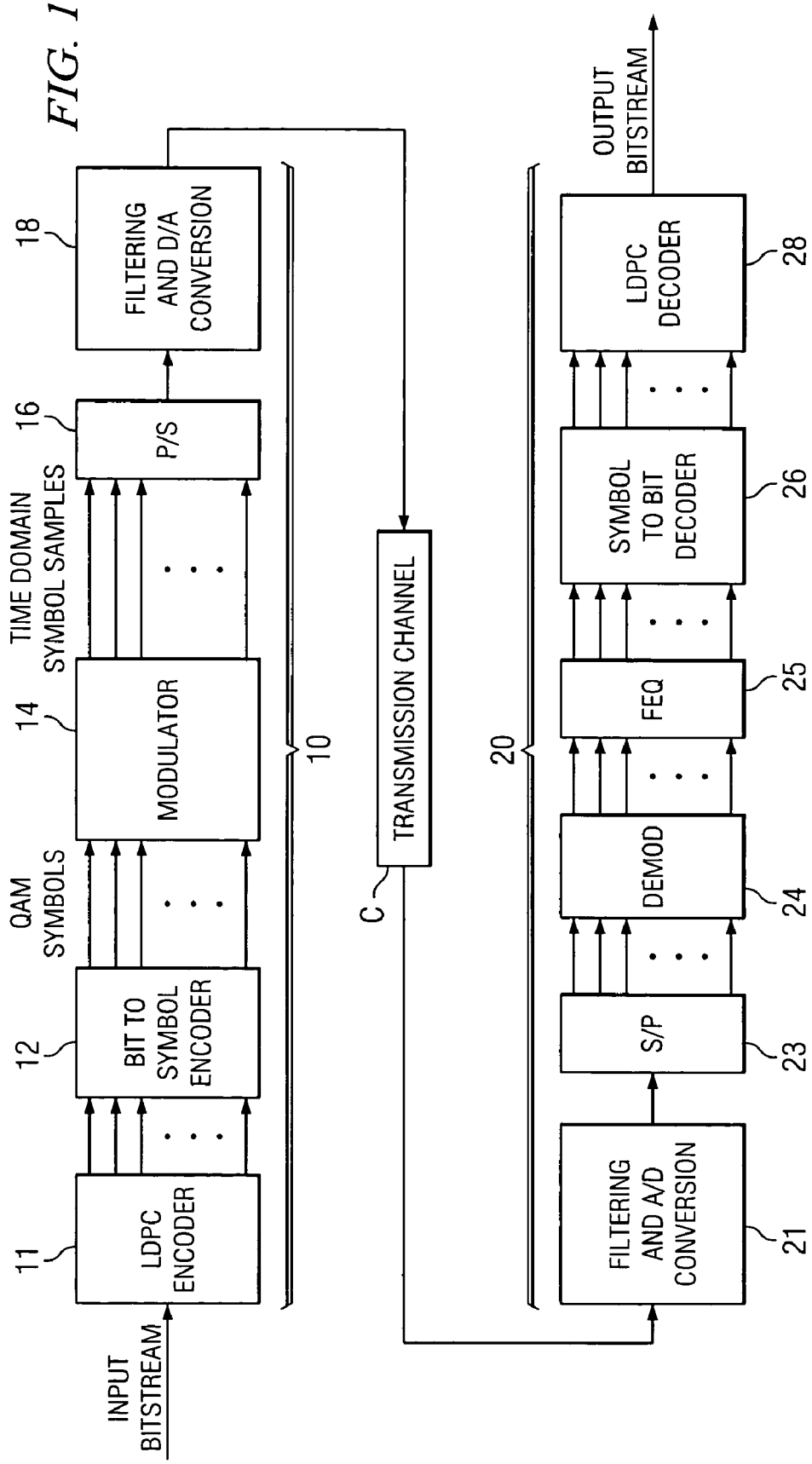
FIG. 1 is a functional block diagram of communications between two OFDM transceivers, where at least the transmitting transceiver is constructed according to a first preferred embodiment of the invention.

FIG. 1 functionally illustrates an example of a somewhat generalized communication system into which the preferred embodiment of the invention is implemented in connection with a wireless broadband communications environment, such as contemplated by the IEEE 802.16 wireless broadband standard. As mentioned above, it is of course contemplated that this generalized arrangement is provided by way of context only. In the system of FIG. 1, only one direction of transmission (from transmitting transceiver 10 over transmission channel C to receiving transceiver 20) is illustrated. It will of course be understood by those skilled in the art that data will also be communicated in the opposite direction, with transceiver 20 as the transmitting transceiver and transceiver 10 as the receiving transceiver. Typically, this reverse communication will be carried out in a similar manner as the "forward" direction communication, but multiplexed in either frequency or time to avoid interference.

As shown in FIG. 1, transmitting transceiver 10 receives an input bitstream that is to be transmitted to receiving transceiver 20. The input bitstream may be generated by a computer at the same location (e.g., the central office) as transmitting transceiver 10, or alternatively and more likely is generated by a computer network, in the Internet sense, that is coupled to transmitting transceiver 10. Typically, this input bitstream is a serial stream of binary digits, in the appropriate format as produced by the data source.

According to this embodiment of the invention, LDPC encoder function 11 digitally encodes the input bitstream for error detection and correction purposes. According to this embodiment of the invention, a redundant LDPC code is applied by encoder function 11, with the particular code selected to facilitate implementation and performance of LDPC encoder function 11, as will be apparent from the following description. The specifics of the code will become apparent from the description of this encoder function, presented below relative to the description of the construction and operation of transmitting transceiver 10 according to the preferred embodiment of the invention. In general, the coded bits include both the payload data bits and also code bits that are selected, based on the payload bits, so that the application of the codeword (payload plus code bits) to the sparse LDPC parity check matrix equals zero for each parity check row. After application of the LDPC code, bit to symbol encoder function 12 groups the incoming bits into symbols that modulate one or more carrier frequencies in the eventual broadband transmission.

Figure 2:
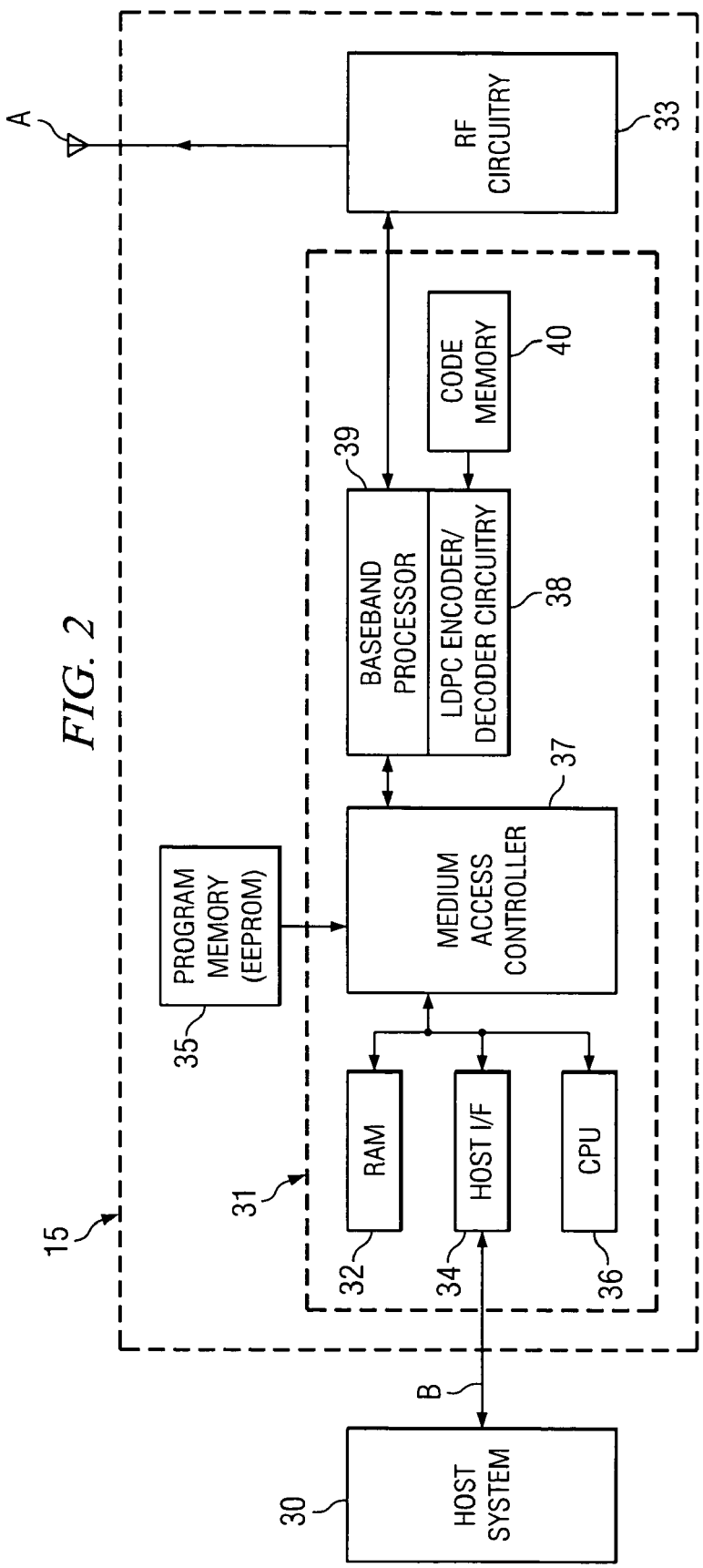
FIG. 2 is an electrical diagram, in block form, of a transceiver constructed according to the preferred embodiments of the invention.

FIG. 2 illustrates an exemplary construction of transceiver 15, in the form of a wireless broadband network adapter. The architecture of transceiver 15 may be applied to either of transmitting transceiver 10 or receiving transmitter 20, of FIG. 1; it is contemplated, however, as well known in the art, that some differences in architecture and realization will exist, between transceivers 10, 20 in a conventional DSL system, for example, because of differences in functionality required for a central office (CO) transceiver relative to a client premises equipment (CPE) transceiver. It is contemplated that those skilled in the art having reference to this specification will recognize that the high-level architecture of transceiver is effectively generic to functions present in transceivers 10, 20, regardless of the location of their implementation. In FIG. 2, transceiver 15 is coupled to host system 30 by way of a corresponding bus B. Host system 30 corresponds to a personal computer, a laptop computer, or any sort of computing device capable of wireless broadband communications, in the context of a wireless wide area network (WAN) or "metro" area network ("MAN"); of course, the particulars of host system 30 will vary with the particular application. In the example of FIG. 2, transceiver 15 may correspond to a built-in broadband wireless adapter that is physically realized within its corresponding host system 30, to an adapter card installable within host system 30, or to an external card or adapter coupled to host computer 30. The particular protocol and physical arrangement of bus B will, of course, depend upon the form factor and specific realization of transceiver 15. Examples of suitable buses for bus B include PCI, MiniPCI, USB, CardBus, and the like.

Transceiver 15 in this example includes spread spectrum processor 31, which is bidirectionally coupled to bus B on one side, and to radio frequency (RF) circuitry 33 on its other side. RF circuitry 33, which may be realized by conventional RF circuitry known in the art, performs the analog demodulation, amplification, and filtering of RF signals received over the wireless channel and the analog modulation, amplification, and filtering of RF signals to be transmitted by transceiver 15 over the wireless channel, both via antenna A. The architecture of spread spectrum processor 31 into which this embodiment of the invention can be implemented follows that of the TNETW1130 single-chip media access controller (MAC) and baseband processor available from Texas Instruments Incorporated, by way of example, and that corresponds to a wireless LAN realization at customer premises equipment. It is contemplated that the architecture of other transceiver installations, including for wireless broadband communications, whether on the network or client side, can follow a similar generic approach, as modified for the particular application location, as known in the art. This exemplary architecture includes embedded central processing unit (CPU) 36, for example realized as a reduced instruction set (RISC) processor, for managing high level control functions within spread-spectrum processor 31. For example, embedded CPU 36 manages host interface 34 to directly support the appropriate physical interface to bus B and host system 30. Local RAM 32 is available to embedded CPU 36 and other functions in spread spectrum processor 31 for code execution and data buffering. Medium access controller (MAC) 37 and baseband processor 39 are also implemented within spread-spectrum processor 31 according to the preferred embodiments of the invention, for generating the appropriate packets for wireless communication, and providing encryption, decryption, and wired equivalent privacy (WEP) functionality. Program memory 35 is provided within transceiver 15, for example in the form of electrically erasable/programmable read-only memory (EEPROM), to store the sequences of operating instructions executable by spread-spectrum processor 31, including the coding and decoding sequences according to the preferred embodiments of the invention, which will be described in further detail below. Also included within transceiver 15, in the form of a wireless adapter, are other typical support circuitry and functions that are not shown, but that are useful in connection with the particular operation of transceiver 20.

According to the preferred embodiments of the invention, LDPC encoding and decoding is embodied in specific custom architecture hardware associated with baseband processor 39, and shown as LDPC encoder/decoder circuitry 38 in FIG. 2. LDPC encoder/decoder circuitry 38 is custom circuitry for performing the coding of transmitted and data packets according to the preferred embodiments of the invention. Alternatively, it is contemplated that baseband processor 39 itself, or other computational devices within transceiver 15, may have sufficient computational capacity and performance to implement the encoding and decoding functions described below in software, specifically by executing a sequence of program instructions. It is contemplated that those skilled in the art having reference to this specification will be readily able to construct such a software approach, for those implementations in which the processing resources are capable of timely performing such encoding.

In either case, code memory 40 is provided within transceiver 15, for storing the parameters of the particular codes that are available for use in the encoding and decoding of coded transmissions by transceiver 15. More specifically, it is contemplated that the various shift values for the cyclically shifted identity submatrices used in the LDPC coding and decoding for each of a selected set of available codes, as will be described below, will be stored in code memory 40. As such, the size of code memory 40 will be in large part determined by the number and size of the LDPC codes to be available for transceiver 15.

Referring back to FIG. 1 in connection with the operation of transceivers 10 and 20, LDPC encoder 11 and bit-to-symbol encoder 12 generate encoded symbols that are then applied to modulator 14, which generates a datastream according to the particular modulation technique for the communications protocol. The particular modulation applied by modulator 14 may be a single carrier modulation, as used according to some of the options under the IEEE 802.16 wireless broadband standards. Alternatively, modulator 14 may be a multiple-carrier modulator, as used in OFDM modulation contemplated for certain IEEE 802.16 wireless broadband modes, or as used in Discrete Multitone modulation (DMT) for conventional DSL communications. In the case of multiple-carrier modulation, modulator 14 will apply an inverse Discrete Fourier Transform (IDFT) function to the output of encoder 12, to associate each input symbol with one subchannel in the transmission frequency band, and to generate a corresponding number of time domain symbol samples according to the Fourier transform. In any case, to the extent that modulator 14 generates multiple time domain symbol samples, this datastream is converted into a serial stream of samples by parallel-to-serial converter 16. In the single carrier example, functions 11 through 16 convert the input bitstream into a sequence of complex amplitudes (e.g., according to a QAM constellation) corresponding to the symbol values. In the multiple carrier implementation, functions 11 through 16 will convert the input bitstream into a serial sequence of symbol values representative of the sum of a number of modulated subchannel carrier frequencies, the modulation indicative of the various data values, and including the appropriate redundant code bits for error correction. Those skilled in the art having reference to this specification will readily recognize that each of functions 11 through 16 may be carried out, and preferably actually are carried out, as digital operations executed by a digital signal processor (DSP).

Filtering and conversion function 18 then processes the datastream for transmission. Function 18 applies the appropriate digital filtering operations, such as interpolation to increase sample rate and digital low pass filter for removing image components, for the transmission. The digitally-filtered datastream signal is then converted into the analog domain and the appropriate analog filtering is then applied to the output analog signal, prior to its transmission.

The output of filter and conversion function 18 is then applied to transmission channel C, for forwarding to receiving transceiver 20. The transmission channel C will of course depend upon the type of communications being carried out. In the wireless communications context, the channel will be the particular environment through which the wireless broadband or LAN transmission takes place. Alternatively, in the DSL context, the transmission channel is physically realized by conventional twisted-pair wire. In any case, transmission channel C adds significant distortion and noise to the transmitted analog signal, which can be characterized in the form of a channel impulse response.

This transmitted signal is received by receiving transceiver 20, which, in general, reverses the processes of transmitting transceiver 10 to recover the information of the input bitstream. Filtering and conversion function 21 in receiving transceiver 20 processes the signal that is received over transmission channel C. Function 21 applies the appropriate analog filtering, analog-to-digital conversion, and digital filtering to the received signals, again depending upon the technology of the communications. In the DSL context, this filtering can also include the application of a time domain equalizer (TEQ) to effectively shorten the length of the impulse response of the transmission channel C. Serial-to-parallel converter 23 converts the filtered datastream into a number of samples that are applied to demodulator function 24. In the single channel example, demodulator function 24 will convert the received amplitude (typically complex) into a digital symbol value, while in the multiple channel example, demodulator function 24 applies a Discrete Fourier Transform (DFT) to recover the modulating symbols at each of the subchannel frequencies, reversing the IDFT performed by modulator 14 in transmitting transceiver 10. In either case, demodulator 24 outputs a frequency domain representation of a block of transmitted symbols, multiplied by the frequency-domain response of the effective transmission channel. Recovery function 25 then effectively divides out the frequency-domain response of the effective channel, for example by the application of a frequency domain equalizer (FEQ), to recover an estimate of the modulating symbols. Symbol-to-bit decoder function 26 then demaps the recovered symbols, and applies the resulting bits to LDPC decoder function 28.

LDPC decoder function 28 reverses the encoding that was applied in the transmission of the signal, to recover an output bitstream that corresponds to the input bitstream upon which the transmission was based. This output bitstream is then forwarded to the host workstation or other recipient. In the exemplary transceiver 15 of FIG. 3, this decoding operation is carried out by LDPC encoder/decoder circuitry 39, using the shift and other parameters for the selected code as stored in code memory 40. An example of an architecture for LDPC decoder function 28, as implemented in LDPC encoder/decoder circuitry 39 as desired, is described in the above-incorporated copending patent application Ser. No. 10/329,597, filed Dec. 26, 2002, now published as U.S. Patent Publication No. US 2004/0034828, and my copending patent application Ser. No. 10,806,879, filed Mar. 23, 2004, and now published as U.S. Patent Publication No. US 2004/0194007 A1, both commonly assigned herewith and incorporated herein by this reference.

LDPC Encoding

The theory of operation of the preferred embodiment of the invention will now be described, following which its implementation into LDPC encoding function 11 in transceiver 10, in the form of LDPC encoder circuitry 38 operating in cooperation with baseband processor 39, will then be described.

By way of nomenclature, the LDPC code is fundamentally contained within an mxj parity check matrix H that satisfies the following equation, when multiplied by the true transmitted code word vector c:

$$H \cdot c = 0 \tag{4}$$

over Galois Field (2). For a single one of the m rows in parity check matrix H, this parity check amounts to:

$$H_1 c_1 + H_2 c_2 + \ldots + H_j c_j = 0 \tag{5a}$$

over GF(2). The example of the parity-check equation (5a) thus logically becomes, for an exemplary row of parity check matrix H having a "1" in its columns 1, 3, 4, and 7:

$$c_1 \oplus c_3 \oplus c_4 \oplus c_7 = 0 \tag{5b}$$

For systematic codes, such as the LDPC codes applied by LDPC encoder circuitry 38 according to this invention, code word vector c expressly contains an information portion $c_i$, which presents the information bits or payload of the code word, and parity portion $c_p$, which presents the parity check bits. For the example of an LDPC code of code rate 1:2, information portion $c_i$ and parity portion $c_p$ each constitute one-half of code word vector c.

Therefore, once the parity check matrix H is defined, and because the information bits $c_i$ of code word vector c are known, the process of encoding amounts to solving the parity check equation:

$$[H_p | H_i] \begin{bmatrix} c_p \\ c_i \end{bmatrix} = 0 \tag{6a}$$

for the parity bits $c_p$, where the matrices $H_p$ and $H_i$ correspond to the portions of parity check matrix H that are applied to the parity and information bits of code word vector c, respectively. Rewriting equation (6a), the encoding problem can be expressed as:

$$H_p c_p = H_i c_i \tag{6b}$$

and solving for parity bits $c_p$. In the general case, this solution requires the generation of an inverse matrix, namely the inverse of the parity matrix portion $H_p$. As known in the art, the calculations and memory requirements for such an operation, particularly for relatively large codewords as contemplated in modern communications, requires sufficient resources that this brute force approach to solving for parity portion $c_p$ for a given information portion $c_i$ is not efficient, especially in the hardware sense.

This encoding of a message frame can be executed in a straightforward if not brute force manner, using conventional programmable integrated circuits such as digital signal processors and the like. Examples of recent encoding techniques are described in Richardson and Urbanke, "Efficient Encoding of Low-Density Parity-Check Codes", *IEEE Trans. on Information Theory*, Vol. 47, No. 2 (February 2001), pp. 638-656. However, as mentioned above, these conventional techniques do not lend themselves to efficient hardware realization. The encoders described in my copending patent application Ser. No. 10/724,280, filed Nov. 28, 2003, now published as U.S. Patent Publication No. US 2004/0148560 A1, and in my copending patent application Ser. No. 11/201, 391, filed Aug. 10, 2005, both commonly assigned herewith and incorporated herein by this reference, take advantage of the quasi-cyclic structure of the family of LDPC codes described in U.S. Patent Publications No. US 2004/0034828 and No. US 2004/0194007 A1 to arrive at substantial efficiencies in the encoding process and hardware.

FIG. 3 illustrates an example of a macro parity check matrix $H_M$, which represents an LDPC parity check matrix H. Macro parity check matrix $H_M$ illustrates that parity check matrix H has a column and row block structure in which each matrix entry represents a submatrix block that is a pxp submatrix. In this example, therefore, because macro parity check matrix $H_M$ has twenty-four block columns and twelve block rows, the full parity check matrix H has 24p columns and 12p rows. In this representation of FIG. 3, each "1" entry in macro parity check matrix $H_M$ indicates that the corresponding pxp submatrix, or block, is a cyclically shifted identity matrix (the number of columns of the shift may vary from submatrix to submatrix, but is not shown in FIG. 3). Those entries of macro parity check matrix $H_M$ that are zero-valued (shown blank in FIG. 3, for clarity), correspond to a zero-valued block at that location. As evident from the representation of macro parity check matrix $H_M$ of FIG. 3, parity check matrix H is indeed a low density, or sparse, matrix. And in this example, the first twelve block columns (1 through 12) of macro parity check matrix $H_M$ correspond to parity matrix portion $H_p$ of equations 6a and 6b, while the last twelve block columns (13 through 24) of macro parity check matrix $H_M$ correspond to the information matrix portion $H_i$ of equations 6a and 6b. As such, the code represented by macro parity check matrix $H_M$, in this example, has a code rate of 1:2.

Length-Reduced Codes

As discussed above, transceiver 15 and the infrastructure into which it is deployed may be required to have the capability of operating according to a selected one of a standardized set of LDPC codes. For example, according to the IEEE 802.16(e) standard for wireless broadband access, nineteen possible LDPC code word lengths are to be made available, each at three possible code rates. Specifically, as described in "LDPC coding for OFDMA PHY", Submission IEEE C802.16e-05/006 (IEEE 802.16 Broadband Wireless Access Working Group, Jan. 10, 2005), specifies LDPC codes for the nineteen block (or code word) sizes of 576, 672, 768, 864, 960, 1056, 1152, 1248, 1344, 1440, 1536, 1632, 1728, 1824, 1920, 2016, 2112, 2208, and 2304 bits. These particular code sizes are selected multiples of m=24; in general, the parameter m refers to the number of submatrices in a given row of the block parity matrix (including both information and parity blocks), and the multiple, ranging from 24 to 96 in this example, corresponds to the number p of columns (and thus rows) within each submatrix. Each of these code word sizes is specified as available for code rates of 1:2, 2:3, and 3:4 (1/2, 2/3, 3/4), resulting in fifty-seven different LDPC codes that are to be stored in code memory 40, or the equivalent memory resource, at each transceiver 15. It has been observed that this requirement results in substantial cost in chip area for the memory to store the code information for each of these codes, and also in substantial time, effort, and thus cost on the part of the hardware manufacturer to design and evaluate each of these codes.

According to the preferred embodiment of the invention, a subset of these code word sizes are selected to be implemented fully and directly, with the other code word sizes to be generated by reducing the length of one of the code words in the subset. FIG. 4 illustrates a generalized process, executable for or by transceiver 15, of selecting the appropriate code word size from the subset, and of selecting the appropriate length-reduction, to attain the desired code of the subset. It is contemplated that the generalized process of FIG. 4 will be executed for both transmission and receipt, for example on a packet basis, upon the initiation of a communication session, depending upon the transceiver with which transceiver 15 will be communicating, and perhaps also depending upon the channel characteristics. Alternatively, it is also contemplated that this generalized process may be performed upon power-up of transceiver 15, or further in the alternative may be executed at the time of manufacture and "hard-wired" into transceiver 15.

In process 42, the desired code word length is selected from among the available code word lengths, and in process 44, the desired code rate is selected from among the available code rates. As mentioned above, these selections may be made upon initiation of a communications session, or on power-up, or even at the time of manufacture if desired. Indeed, the present invention enables the ability to maximize code rate depending upon the channel conditions; for example, if the channel is relatively "clean" from a noise standpoint, a higher code rate may be selected in process 44 than would be selected under noisier conditions. The preferred embodiment of the invention may therefore be used to optimize the payload data rate with performance, for specific channel conditions.

As mentioned above, according to the preferred embodiment of the invention, a subset of code word lengths is defined. To produce the code word length and code rate selected from in processes 42, 44, length-reduction techniques are then applied to one of the subset of code word lengths. For example, if the available code word lengths in process 42 are 576, 672, 768, 864, 960, 1056, 1152, 1248, 1344, 1440, 1536, 1632, 1728, 1824, 1920, 2016, 2112, 2208, and 2304 bits, an example of a subset of "starting" code word lengths include code word lengths of 576, 864, 1152, 1440, 1728, 2016 and 2304 bits. In this example of the preferred embodiment of the invention, each of the available code word lengths is derived from one of the subset of starting code word lengths as shown in Table 1:

TABLE 1

| Desired Code Word | Starting Code Word |
|---|---|
| 2304 | 2304 |
| 2208 | 2304 |
| 2112 | 2304 |

TABLE 1-continued

| Desired Code Word | Starting Code Word |
|---|---|
| 2016 | 2016 |
| 1920 | 2016 |
| 1824 | 2016 |
| 1728 | 1728 |
| 1632 | 1728 |
| 1536 | 1728 |
| 1440 | 1440 |
| 1344 | 1440 |
| 1248 | 1440 |
| 1152 | 1152 |
| 1056 | 1152 |
| 960 | 1152 |
| 864 | 864 |
| 768 | 864 |
| 672 | 864 |
| 576 | 576 |

According to the preferred embodiment of the invention, therefore, the starting code word is preferably determined in process 46 by reference to a look-up table in transceiver 15, according to which the starting code word lengths from the subset are mapped to each of the available code word lengths, for example as shown in this Table 1. Of course, the values of Table 1 are illustrated by way of example only, and many alternative arrangements of the available-to-starting code word length mapping may be used. Furthermore, while a single starting code word length is assigned to each desired code word length in the example of Table 1 according to this preferred embodiment of the invention, it is contemplated that more than one possible starting code word length may be made available, perhaps with different starting code word lengths depending on the desired code rate selected in process 44. It is contemplated that these and other alternative mappings and selection processes will be apparent to those skilled in the art having reference to this specification.

Once the starting code word length is determined in process 46, decision 47 is then executed by transceiver 15 to determine whether length-reduction is required in order to derive the desired code word length from the starting code word length. As evident from the example of Table 1, the available code word lengths (i.e., the nineteen code word lengths in the Desired Code Word column) include the subset of starting code word lengths (i.e., the seven starting code word lengths). As such, if the desired code word length selected in process 42 is one of the subset of starting code word lengths, no length-reduction is required. Decision 47 then returns a NO result, and control passes to process 51 for reordering if necessary according to the particular code standard. Process 53 in which encoding or decoding (or both), as the case may be, is then carried out using the desired code word length and code rate selected in processes 42, 44.

If, however, length-reduction is required as a result of selection of the desired code word length and its mapping to one of the subset of code word lengths (decision 47 is YES), control passes to process 48, in which the extent of length reduction is determined. According to the preferred embodiment of the invention, the determination of length reduction for a given desired code word length and code rate is executed, in process 48, by reference to a look-up table that maps a number S of bits to be shortened and a number P of bits to be punctured from the starting code word determined in process 46, to the desired code word length and desired code rate selected in processes 42, 44. Table 2 illustrates an example of such a mapping, for the example of available code word lengths and the selected subset shown in Table 1.

TABLE 2

| Desired Code Word | Starting Code Word | Code Rate 1:2 | Code Rate 2:3 | Code Rate 3:4 |
|---|---|---|---|---|
| 2304 | 2304 | S = 0; P = 0 | S = 0; P = 0 | S = 0; P = 0 |
| 2208 | 2304 | S = 48; P = 48 | S = 64; P = 32 | S = 72; P = 24 |
| 2112 | 2304 | S = 96; P = 96 | S = 128; P = 64 | S = 144; P = 48 |
| 2016 | 2016 | S = 0; P = 0 | S = 0; P = 0 | S = 0; P = 0 |
| 1920 | 2016 | S = 48; P = 48 | S = 64; P = 32 | S = 72; P = 24 |
| 1824 | 2016 | S = 96; P = 96 | S = 128; P = 64 | S = 144; P = 48 |
| 1728 | 1728 | S = 0; P = 0 | S = 0; P = 0 | S = 0; P = 0 |
| 1632 | 1728 | S = 48; P = 48 | S = 64; P = 32 | S = 72; P = 24 |
| 1536 | 1728 | S = 96; P = 96 | S = 128; P = 64 | S = 144; P = 48 |
| 1440 | 1440 | S = 0; P = 0 | S = 0; P = 0 | S = 0; P = 0 |
| 1344 | 1440 | S = 48; P = 48 | S = 64; P = 32 | S = 72; P = 24 |
| 1248 | 1440 | S = 96; P = 96 | S = 128; P = 64 | S = 144; P = 48 |
| 1152 | 1152 | S = 0; P = 0 | S = 0; P = 0 | S = 0; P = 0 |
| 1056 | 1152 | S = 48; P = 48 | S = 64; P = 32 | S = 72; P = 24 |
| 960 | 1152 | S = 96; P = 96 | S = 128; P = 64 | S = 144; P = 48 |
| 864 | 864 | S = 0; P = 0 | S = 0; P = 0 | S = 0; P = 0 |
| 768 | 864 | S = 48; P = 48 | S = 64; P = 32 | S = 72; P = 24 |
| 672 | 864 | S = 96; P = 96 | S = 128; P = 64 | S = 144; P = 48 |
| 576 | 576 | S = 0; P = 0 | S = 0; P = 0 | S = 0; P = 0 |

In a general sense, the total number of bits to be shortened (S+P) depends on the difference in length between the desired and starting code words. The ratio of the number of shortened bits S (restricted only to information bits) to the number of punctured bits P (which may be either information or parity bits) depends upon the desired code rate, with higher code rates reducing the number of information bits relative to total bits by shortening more bits than are punctured. As a point of reference, the starting code words are all assumed to be of code rate 1:2. Process 48 thus determines the numbers S, P for the current desired code word length and code rate selected in processes 42, 44, by accessing a look-up table or other facility containing a map such as shown in FIG. 2.

Alternatively, the numbers S, P by which the starting code word length is shortened and punctured, respectively, may be determined according to different constraints than desired code word length and desired code rate. For example, the code rates may not be constrained to one or more specific code rates, but instead the number S of shortened bits or the number P of punctured bits may be constrained to a particular limit (including zero, such that the code word is only punctured, or only shortened) to achieve a particular desired code word length, or in response to current channel conditions. In these alternatives, the resulting code rate may simply result as the optimal code rate (or perhaps simply an adequate code rate) for the combination of the other restraints. It is contemplated that these and other alternatives can be readily implemented by those skilled in the art having reference to this specification In process 50, transceiver 15 next determines the specific bits, or columns of the parity matrix H, that are to be shortened and punctured. In order to arrive at the desired code word length and code rate, however, it is preferred that the selection of the shortened bits and the selection of the punctured bits do not interfere with one another, as this interference would cause a given bit position to be both punctured and shortened. This interference would necessarily result in a code word length and a code rate that differ from that desired, and could result in indeterminate results on decoding. According to the preferred embodiment, selection process 50 is performed in a manner that prevents interference between the shortened and punctured bits, as will now be described relative to FIGS. 5a and 5b.

FIG. 5a illustrates the operation of process 50a that selects the code word bits, specifically information bit positions of the code word, that are to be shortened according to a first preferred embodiment of the invention. Process 50a of FIG. 5a constitutes part of process 50 of FIG. 4, as does process 50b to be described in detail below relative to FIG. 5b. Processes 50a, 50b are thus constituent processes within process 50, and may be performed in any order relative to one another (or simultaneously in parallel with one another, if transceiver 15 is so constructed for parallel operation).

Process 50a begins with process 52, which initializes certain parameters used in this process. Specifically, process 52 initializes index k for the shortened bits $S_k$ to 1, initializing loop index j to 1, initializes parameter $m_s$ to the number of block columns (or submatrices along a block row) in the information portion of the block parity matrix, and initializes block index b to 0. Process 54 is then executed to determine the shortened bit position $S_k$=j+bp, where p is the number of columns or bit positions within each block column of macro parity check matrix $H_M$. For this initial instance, the position of the first shortened bit $S_1$ is the first column of the first information block column (i.e., column 1). Decision 55 determines whether the current index k of shortened bits equals the total number S of bits to be shortened, as determined in process 48. If not (decision 55 is NO), shortening bit index k and block index b are incremented in process 56, and block index b is tested against the number $m_s$ of block columns in the information portion of the code word. If all block columns have not yet had a shortened bit assigned for this iteration (decision 57 is NO), control returns to process 54, for selection of the next shortened bit position $S_k$ using the incremented block index b.

Upon all of the block columns in the information portion of the code word having had a shortening bit assigned (decision 57 is YES), but with shortening bits remaining to be assigned (decision 55 necessarily being NO in order to reach decision 57), loop index j is then incremented in process 58, and block index b is reset to 0. Control then returns again to process 54, at which point the next shortened bit position $S_k$ is determined. In effect, the value of loop index j indicates the bit position that is shortened within each information block column; with loop index j=1, the first bit position is selected in each information block column, and after the incrementing of loop index j, then the second bit position is selected in each information block column, and so on until the number S of shortening bits determined in process 48 is reached (decision 55 is YES). Process 60 is then performed, to store the set $\{S_k\}$ of shortened bit positions in code memory 40 or other memory as appropriate.

Referring to FIG. 5b, the operation of process 50b in determining the bit locations to be punctured in the code words to be transmitted, according to this first preferred embodiment of the invention, will now be described in detail. As mentioned above, the order in which processes 50a, 50b are executed is not important, as neither of processes 50a, 50b depend on the other; indeed, processes 50a, 50b may be performed simultaneously and in parallel with one another.

Process 62 initializes the parameters of punctured bit $P_k$ index k to 1, initializes loop index j to p, which is, as mentioned above, the number of columns or bit positions within each block column of the block parity matrix $H_M$. Process 62 also initializes parameter $m_p$ to the number of block columns in macro parity check matrix $H_M$ (including both the information and parity portions) and initializes block index b to 0. Process 64 is then executed to determine a punctured bit position $P_k$=j+bp, which in this initial instance ($P_1$) will be the last column of the first block column (i.e., column p). In decision 65, the value of index k of punctured bits is compared with the total number P of bits to be punctured, as determined in process 48. If the desired P punctured bits are not yet all determined (decision 65 is NO), bit index k and block index b are incremented in process 66. Block index b is compared with the number $m_p$ of block columns in the macro parity check matrix $H_M$. If all block columns have not yet had a punctured bit assigned for this iteration for this current value of loop index j (decision 67 is NO), control returns to process 64, in which the next punctured bit position $P_k$ is calculated.

As previously described, decision 67 is not evaluated unless decision 65 indicates that additional punctured bits remain to be determined (i.e. decision 65 is NO). In that case, upon decision 67 returning a YES result, indicating that all of the block columns of macro parity check matrix $H_M$ have had a punctured bit assigned in this pass, block index b is reset to 0 and loop index j is decremented, both in process 68, following which control returns to process 64, for determination of the next punctured bit position $P_k$. In effect, according to this first preferred embodiment of the invention, the punctured bit positions begin with the last bit position within each block column of the code word, followed by selection of the next-to-last bit position in each block column for the next pass of loop index j, and so on until the number P of puncturing bits, as selected in process 48, is reached (decision 65 is YES). The set $\{P_k\}$ of punctured bit positions is then stored in code memory 40 or elsewhere, in process 70.

As mentioned above, it is contemplated that process 50 for selecting the bit locations of the punctured and shortened bits may be performed on a packet basis, or upon starting a communications session. Alternatively, it is contemplated that the particular bit positions to be shortened and punctured may be determined a priori, for example prior to manufacture, with the locations stored by processes 60, 70 being hard-wired or stored in non-volatile memory of transceiver 15. In this manner, the calculations of process 50 need not be carried out in each device, but instead may simply be retrieved from memory upon selection of the desired code word size and code rate. It is contemplated that those skilled in the art having reference to this specification will be able to choose the appropriate implementation for a given implementation.

The specific locations of the shortened and punctured bits selected according to this invention, in process 50 of FIG. 4, may be derived by other approaches and algorithms. For example, puncturing bits may be constrained to the parity portion of the starting code word, if desired. The particular initial values for the indices may be offset (i.e., either or both of the bit position or the block column starting points), the direction of stepping of the indices (i.e., incrementing one or both the indices up in value, or incrementing one or both the indices down to decrement its value), and the step size of the incrementing of the indices, may vary from that described above, to list a few examples. Furthermore, the selected shortened and punctured bit positions may be selected from a subset of the information block columns, or of all block columns.

In addition, the algorithms applied may not necessarily avoid interference between the shortened and punctured bits, relying instead on detecting and bookkeeping for bit positions that are both punctured and shortened. Preferably, however, interference between the shortening bits and the puncturing bits is avoided, as occurs in the execution of processes 50a, 50b described above. And referring now to FIGS. 6a and 6b, alternative approaches 50a', 50b' for selecting these shortening and puncturing bits, according to a second preferred embodiment of the invention, will now be described. It has been observed that these alternative approaches can provide even better code performance than the shortened and punctured code words generated by processes 50*a*, 50*b*, as it is believed that the distribution of shortening and puncturing bits is more uniform according to this second preferred embodiment of the invention, while still avoiding interference between the shortened and punctured bit positions.

Figure 6A:
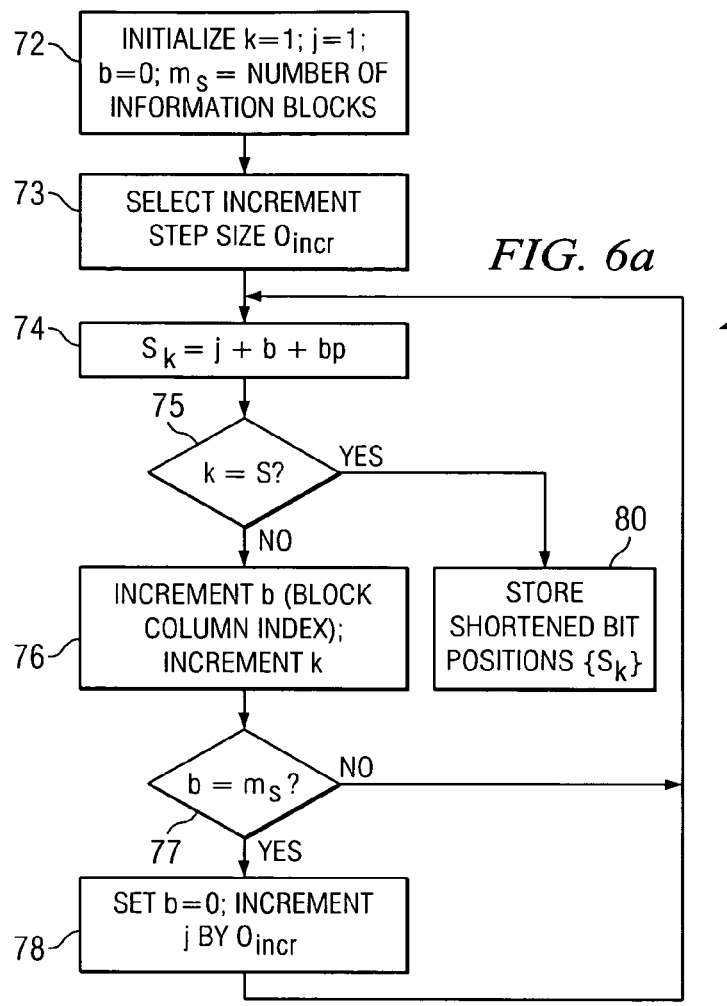
FIGS. 6a and 6b are flow diagrams illustrating the selection of shortening bits and puncturing bits, respectively, in the operation of FIG. 4 according to a second preferred embodiment of the invention.

Referring to FIG. 6*a*, process 50*a*' for selecting the code word bit positions to be shortened according to this second preferred embodiment of the invention will now be described. As before, processes 50*a*', 50*b*' may be performed in either order, or in parallel, as desired in the particular implementation. Process 50*a*' begins with process 72, in which the parameters of shortened bit $S_k$ index k is initialized to 1, loop index j is initialized to 1 (i.e., the first column position within each block column of the block parity matrix $H_M$), parameter $m_s$ is initialized to the number of block columns in the information portion of macro parity check matrix $H_M$, and block index b is initialized to 0. According to this second preferred embodiment of the invention, an increment step size $O_{incr}$ is then selected in process 73. In order to attain uniform distribution of the shortened bits throughout the blocks of the code word, according to this embodiment of the invention, increment step size $O_{incr}$ varies with the size of the code word, specifically with the number p of columns or bits within each submatrix of the starting code word size. In one exemplary embodiment of the invention, corresponding to the values of Tables 1 and 2 in this specification, the values of increment step size $O_{incr}$ are selected in process 73 according to Table 3:

TABLE 3

| | Starting code word size | | | | | |
|---|---|---|---|---|---|---|
| | 864 | 1152 | 1440 | 1728 | 2016 | 2304 |
| p | 36 | 48 | 60 | 72 | 84 | 96 |
| $O_{incr}$ | 2 | 4 | 5 | 7 | 9 | 11 |

As evident from Table 3, the increment step size $O_{incr}$ increases with increasing code word size, specifically with increases in the number p of columns within each submatrix or block of the code word. Again, in this example, the number of block columns in macro parity check matrix $H_M$ is twenty-four, such that the code word size is the product of twenty-four and number p. It is contemplated that the specific values of increment step size $O_{incr}$ can be readily determined for these code examples, or for other codes, empirically or by simulation by one skilled in the art having reference to this specification.

Process 50*a*' then proceeds in a similar manner as process 50*a* described above. In process 74, a shortened bit position $S_k$ is calculated as $S_k=j+b+bp$. Again, the initial instance ($S_1$) will be the first column of the first block column (i.e., column 1). In decision 75, shortened bit index k is compared with the total number S of bits to be shortened that was determined in process 48. If additional shortened bits remain, (decision 75 is NO), bit index k and block index b are incremented in process 76, and decision 77 compares block index b with the number $m_s$ of information portion block columns in macro parity check matrix $H_M$. If all information portion block columns have not yet had a shortened bit assigned for this iteration for this current value of loop index j (decision 77 is NO), control returns to process 74, in which the next shortened bit position $S_k$ is calculated. But in this embodiment of the invention, the block index b is added into the selected bit position determination $S_k=j+b+bp$. Accordingly, if the first column is selected for shortening in the first block column, then the second column will be shortened in the second block column, the third column in the third block column shortened, and so on.

As previously described, upon decision 77 returning a YES result, indicating that all of the information block columns of macro parity check matrix $H_M$ have had a shortened bit assigned for this current value of loop index j, block index b is reset to 0 and loop index j is incremented by increment step size $O_{incr}$ in process 78, following which control returns to process 74 to determine the next shortened bit position $S_k$. For the next pass (j=2), therefore, the second shortened bit to be selected in the first block column (b=0) is the column ($O_{incr}+1$), since the initial value of j was 1. For example, if the starting code word size is 2304, the value of p is 96 (24 times 96 being 2304), and the value of $O_{incr}$ is eleven; the second shortened bit to be selected in the first block column will therefore be the twelfth bit or column, the third shortened bit in this first block column will be the twenty-third bit (after the next instance of increment process 78), and so on. And for this starting code word size of 2304, the second block column will have its second, thirteenth, twenty-fourth, thirty-fifth, etc., bits shortened until the number k of shortened bits reaches the selected number $S_k$. Upon determination of all S shortened bits (decision 75 is YES), the set {$S_k$} of shortened bit locations is stored in memory 40 or elsewhere, in process 80.

Figure 6B:
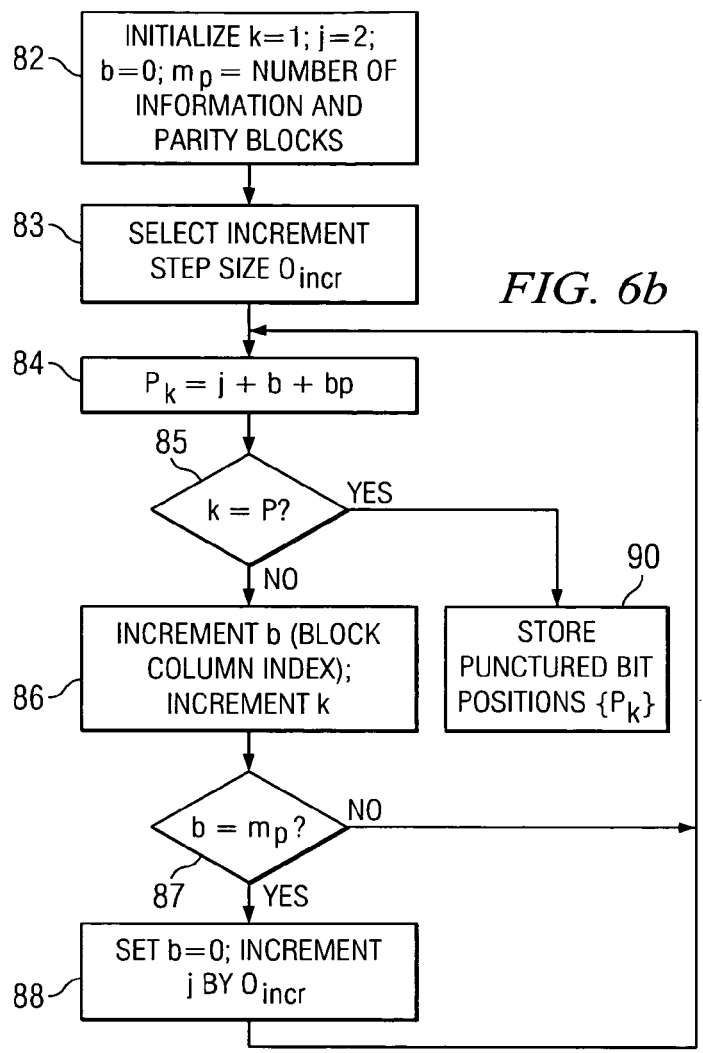

The selection of bit locations to be punctured is carried out, according to this second preferred embodiment of the invention, in process 50*b*', which will now be described with reference to FIG. 6*b*. Process 82 initializes the values of parameters including initializing punctured bit index k to the value 1, initializing loop index j to the value 2, initializing block index b to the value 0, and initializing the parameter $m_p$ to the number of information and parity block columns in macro parity check matrix $H_M$ (e.g., twenty-four in the example of Tables 1 through 3). In process 83, increment step size $O_{incr}$ is selected (if not previously done so in the execution of process 50*a*'), based on the starting code word size and the number p of bits or columns in each block column of macro parity check matrix $H_M$, as described above relative to Table 3.

Process 84 then determines a punctured bit position $P_k=j+b+bp$. In the first instance ($P_1$) the second column of the first block column (i.e., column 2) will be punctured, since loop index j is initialized to the value 2. Decision 85 determines whether puncturing process 50*b*' is complete by comparing bit index k with the total number P of bits to be punctured, as selected in process 48. If additional punctured bits remain, (decision 85 is NO), bit index k and block index b are incremented in process 86. Decision 87 then compares block index b with the number $m_p$ of block columns (information and parity) in macro parity check matrix $H_M$. If block columns remain to be punctured for this current value of loop index j (decision 87 is NO), control returns to process 84, in which the next punctured bit position $P_k$ is calculated. According to this embodiment of the invention, as in process 50*a*', the block index b is added into the selected bit position determination $P_k=j+b+bp$. In this example, therefore, the punctured columns include the second column in the first block column, the third column in the second block column, the fourth column in the third block column, and so on. Comparison of these columns with those that are shortened in process 50*a*' readily shows that the punctured and shortened bits of the code word do not interfere with one another.

Upon selection of a punctured bit for each of the block columns of macro parity check matrix $H_M$ (decision 87 is YES) for a given value of loop index j, process 88 resets block index b to 0 and increments loop index j by increment step size $O_{incr}$, and control returns to process 84 for selection of the next punctured bit position $P_k$. For the next pass (j=2), therefore, the second punctured bit for the first block column (b=0) is the column ($O_{incr}$+2), since the initial value of j was 2. In the example in which the starting code word size is 2304 (p=96) and the value of $O_{incr}$ is eleven, the second punctured bit in the first block column is the thirteenth bit or column, the third shortened bit in this first block column is the twenty-fourth bit, and so on. The second block column will have its third, fourteenth, twenty-fifth, etc. bits punctured, and so on. Upon selection of all P of the punctured bits (decision 85 is YES), the set of punctured bit positions $\{P_k\}$ is stored in memory 40, or another appropriate resource, in process 90, completing process 50b'.

As mentioned above, it is contemplated that variations on the particular algorithms used to determine the positions of punctured and shortened bits within the code word, according to this invention, may be derived by those skilled in the art having reference to this specification. In any event, however, according to this invention, the punctured and shortened bit locations are determined in a manner that ensures that the same code word bit is not both shorted and punctured, for a reasonable extent of length-reduction of the code word. The particular examples described above relative to FIGS. 5a, 5b, 6a, 6b are believed to be relatively simple and straightforward to implement, by way of sequences of program instructions executable within transceiver 15, and also to provide excellent code performance. In that regard, the second preferred embodiment of the invention as described for processes 50a', 50b' relative to FIGS. 6a and 6b has been observed, through simulation, to provide improved code performance relative to processes 50a, 50b of FIGS. 5a and 5b, by more uniformly distributing the selected punctured and shortened bit positions throughout the code word.

Referring back to FIG. 4, the overall operation of transceiver 15 after selection of the shortened and punctured code word bits in process 50 continues with process 51, in which the columns and rows of the code word are reordered as necessary. It has been observed that, according to some communications standards, the positions of information and parity bits within a systematic code word may vary, even for code words having the same code word size and code rate. For example, some communications standards present the information bits to the left of the parity bits, and others present the parity bits to the left of the information bits. The examples of process 50 described above are specified for the arrangement in which the information bits are to the left of the parity bits, such that (for code rate 1:2) blocks 1 through 12 of macro parity check matrix $H_M$ contain the information bits, and blocks 13 through 24 contain the parity bits. To the extent that reordering of the code word is necessary to conform the punctured and shortened bits as selected to those of the code word as transmitted, process 51 is applied to effect such reordering. Alternatively, the reordering may be performed prior to process 50, and the algorithms adjusted accordingly, if desired. It is contemplated that those skilled in the art having reference to this specification can readily effect reordering process 51 for a particular application.

Figure 7A:
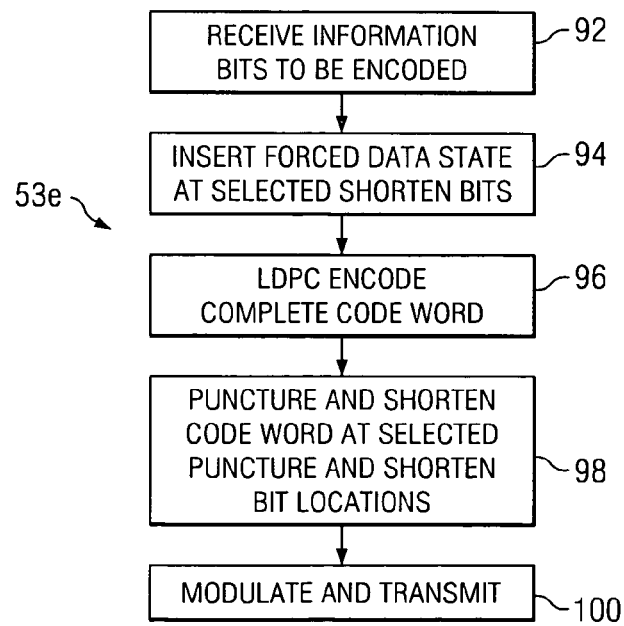
FIGS. 7a and 7b are flow diagrams illustrating the encoding and decoding of payload data according to the preferred embodiments of the invention.

Upon completion of the selection of the shortened and punctured bits of the code word, and the reordering as necessary, transceiver 15 is ready to encode and decode, as the case may be, using the desired code word length and code rate. The encoding of an information word to be transmitted, according to the preferred embodiment of the invention, is illustrated in FIG. 7a with reference to process 53e. It is contemplated that this encoding will be effected by LDPC encoder/decoder circuitry 38 of transceiver 15 in connection with LDPC encoder function 11 (in the data flow diagram of FIG. 1). Detailed examples of architectures for encoder circuitry suitable for use in connection with process 53e are provided in U.S. Patent Publication No. US 2004/0148560 A1, and in my copending patent application Ser. No. 11/201,391, filed Aug. 10, 2005, both commonly assigned herewith and incorporated herein by this reference.

In process 92, LDPC encoder/decoder circuitry 38 receives the information bits that are to be encoded for a given code word to be transmitted. According to this embodiment of the invention, the number of information bits corresponds to the desired code word length, at the desired code rate. In those cases in which shortening and puncturing is to be applied, therefore, the received information bits will be fewer in number than the information bits in the starting code word. Accordingly, in process 94, the bits of the information portion at the selected shortened bit positions $\{S_k\}$ in the information portion of the code word at its longer, starting code word size, are forced to a known or assumed data state (typically "0"). In effect, process 94 lengthens the received block of information bits to be encoded to the size allotted for the information bits in the starting code word. In process 96, LDPC encoder/decoder circuitry 38 encodes the complete code word (i.e., at the starting code word length selected in process 46) according to the particular LDPC code to be applied. The complete code word thus includes parity bit values resulting from the insertion of the forced data state at the shortened bit locations.

After the encoding process 96, the resulting encoded systematic code word, at the starting code word size selected in process 46, is punctured at the bit locations selected in process 50 (for example, as determined in processes 50b, 50b' according to the preferred embodiments of the invention described above), and is then also in process 98, the code word is shortened at the selected shorten bits in the information portion of the code word, as determined in process 50 (e.g., processes 50a, 50a' according to the preferred embodiments of the invention described above). In process 100, the shortened and punctured code word, which is now at the desired code word length and desired code rate, is modulated and transmitted in the conventional manner (e.g., by way of encoder function 12, modulator 14, etc. of FIG. 1).

Figure 7B:
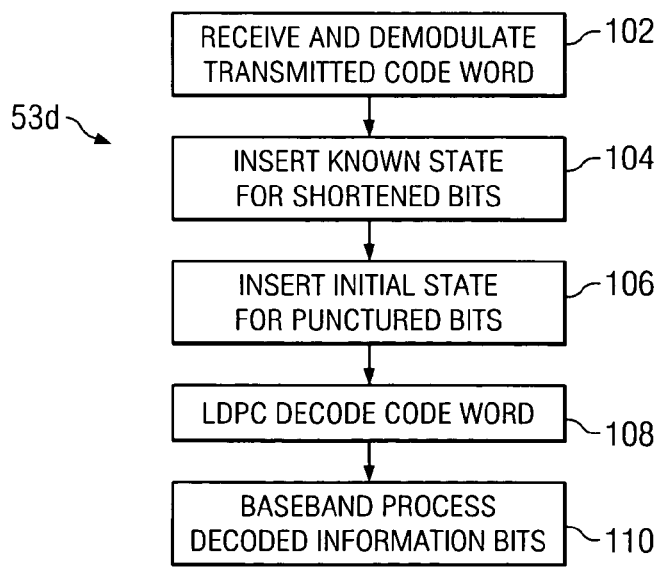

The receipt and decoding of the transmitted code word on the receive side of transceiver 15 according to the preferred embodiments of the invention is illustrated in FIG. 7b. In process 102, the transmitted code word is received from the communications channel, and is demodulated and otherwise processed in the conventional manner up to the point of LDPC decoder function 28 in the exemplary data flow diagram of FIG. 1. This processing results in a length-reduced code word, which amounts to the starting code word less the shortened and punctured bits. In process 104, LDPC encoder/decoder circuitry 38 inserts a known state for the shortened bits; typically, as known in the art, code shortening assumes that both the transmitter and receiver know the shortened bit positions, and also know the forced value at those bit positions. Accordingly, process 104 partially rebuilds the received code word toward its "starting" code word size, by inserting the known forced state at the shortened bit positions. And in process 106, as known in the art, an initial state is also assumed for the punctured bit positions, and inserted into the code word. This assumed initial state may be the same or different than the "forced" data state for the shortened bits, or may be an indeterminate state (i.e., halfway between 0 and 1) if soft decoding is used. Processes 104, 106 may be performed in opposite order, or in parallel, as desired.

In process 108, LDPC encoder/decoder circuitry 38 then effects LDPC decoder function 28, operating on the code word at its "starting" code word length, in order to recover the remainder of the information bits (i.e., those that are not at the forced state, at the shortened bit positions). This LDPC decoding may be carried out in a known manner. Examples of the architecture of LDPC encoder/decoder circuitry 38, on the decoding side, and operation of the same, as suitable for use in connection with the preferred embodiments of the invention, are described in U.S. Patent Publication No. US 2004/0034828, and U.S. Patent Publication No. US 2004/0194007 A1, both commonly assigned herewith and incorporated herein by this reference. The decoded information bits from decoding process 108 are then processed in the conventional manner, at baseband, in process 110, completing the communications process.

According to the preferred embodiments of the invention, numerous important advantages are attained. In those communications applications in which a set of LDPC code word sizes and code rates are required to be available, this invention provides the important benefit of implementing the entire set of code word sizes and code rates with a reduced subset of code word sizes and code rates, with relatively little impact on the overall code performance. For example, rather than nineteen code word sizes at each of three rates (57 combinations in total), seven code word sizes may be implemented, thus saving the implementation of thirty-six combinations in the transmitter and receiver architecture. Not only does this greatly reduce the memory requirements for storage of the various codes and parameters, but this also results in greatly reduced development time and effort for the implementation and testing of circuitry, especially in connection with decoder circuitry. The benefits of reduced test time and effort are not only obtained for the design verification process, but also in the production testing of encoder and decoder hardware. It is also contemplated that substantial integrated circuit chip area can be saved, especially in the realization of control circuitry and the routing of control signals. The preferred embodiments of the invention are also contemplated to be efficiently implemented, considering the relatively straightforward nature of the algorithms for shortening and puncturing the code words.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An apparatus for transmitting encoded signals, comprising:
   a memory resource, for storing data corresponding to selected locations of bit positions of a code word to be shortened and punctured, the selected bit positions determined, for a desired code word length of a set of available code word lengths for a low-density parity-check code, and for a desired code rate, by:
   selecting a starting code word length corresponding to the desired code word length, the starting code word length corresponding to a subset of the set of available code word lengths;
   determining a number of shorten bits to be shortened from an information portion of the starting code word length, and a number of puncture bits to be punctured from the starting code word length, responsive to the desired code rate and to a difference in code word length between the desired code word length and the starting code word length;
   selecting shortened code word bit positions of the starting code word and punctured code word bit positions of the starting code word, to produce a code word having the desired code word length and a number of information bits and a number of parity bits corresponding to the desired code rate;
   circuitry, coupled to the memory resource, for encoding code words at the starting code word length, according to the low-density parity-check code, and for puncturing and shortening the encoded code words at the selected bit positions to obtain length-reduced code words of the desired code word length and at the desired code rate;
   a modulator, for modulating signals corresponding to the length-reduced code words;
   digital-to-analog converter circuitry, for generating an analog signal corresponding to the modulated signals; and
   transmitter circuitry, for transmitting the analog signal over a communications facility.

2. The apparatus of claim 1, wherein the encoding circuitry is for:
   receiving information bits to be transmitted;
   inserting a forced data state at bit positions in an information portion of a code word, the bit positions corresponding to the selected shortened code word bit positions;
   then encoding the information portion of the code word according to a parity check code, to produce a code word having an information portion and a parity portion; and
   then removing bits from the code word at the selected shortened code word bit positions and the selected punctured code word bit positions.

3. The apparatus of claim 1, further comprising:
   circuitry for performing the selecting, determining, and selecting operations, and for storing data corresponding to the selected shortened and punctured code word bit positions in the memory resource.

4. The apparatus of claim 1, wherein the low-density parity check code corresponds to a block parity check matrix comprised of a plurality of submatrices arranged in block rows and block columns, and having an information portion and a parity portion, each of the block columns including a plurality of columns that each correspond to a bit position of the starting code word.

5. The apparatus of claim 4, wherein the shortened code word bit positions of the starting code word stored in the memory resource are selected by:
   initializing a first index to an initial value;
   for each of a plurality of block columns in the information portion of the block parity check matrix, selecting a bit position of the starting code word corresponding to the first index as one of the shortened code word bit positions;
   stepping the first index; and
   repeating the selecting and stepping steps to select the determined number of shorten bits.

6. The apparatus of claim 5, wherein the punctured code word bit positions of the starting code word are selected by:
   initializing a second index to an initial value;
   for each of a plurality of block columns, selecting a bit position of the starting code word corresponding to the second index as one of the punctured code word bit positions;
   stepping the second index; and
   repeating the selecting and stepping steps to select the determined number of puncture bits.

7. The apparatus of claim 6, wherein the initial value of the first index corresponds to the first column of a block column;

wherein the initial value of the second index corresponds to the last column of a block column;
wherein the step of stepping the first index comprises incrementing the first index; and
wherein the step of stepping the second index comprises decrementing the second index.

8. The apparatus of claim 5, wherein the shortened code word bit positions of the starting code word stored in the memory resource are selected by:
initializing a first index to an initial value;
initializing a block index to an initial value corresponding to a first block column of the block parity check matrix;
selecting an increment size value corresponding to the starting code word length;
selecting a bit position of the starting code word, in a block column corresponding to the block index, corresponding to the sum of the value of the first index and the value of the block index, as one of the shortened code word bit positions;
stepping the block index;
repeating the steps of selecting a bit position and stepping the block index for each of a plurality of block columns in the information portion of the block parity check matrix;
stepping the first index by the increment size value, and resetting the block index to the initial value; and
repeating the selecting, stepping, and repeating steps to select the determined number of shorten bits.

9. The apparatus of claim 8, wherein the punctured code word bit positions of the starting code word are selected by:
initializing a second index to an initial value, different from the initial value of the first index;
initializing the block index to the initial value corresponding to a first block column of the block parity check matrix;
selecting a bit position of the starting code word, in a block column corresponding to the block index, corresponding to the sum of the value of the second index and the value of the block index, as one of the punctured code word bit positions;
stepping the block index;
repeating the steps of selecting a bit position and stepping the block index for each of a plurality of block columns of the block parity check matrix;
stepping the second index by the increment size value, and resetting the block index to the initial value; and
repeating the selecting, stepping, and repeating steps to select the determined number of puncture bits.

10. An apparatus for receiving encoded signals, comprising:
receiver circuitry, for receiving an analog signal over a communications facility;
analog-to-digital converter circuitry, for generating a digital signal corresponding to the received analog signals;
a demodulator, for demodulating the digital signal into encoded code words at a desired code word length and a desired code rate;
a memory resource, for storing data corresponding to selected locations of bit positions of a shortened and punctured code word, the selected bit positions determined, for a desired code word length of a set of available code word lengths for a low-density parity-check code, and for a desired code rate, by:
selecting a starting code word length corresponding to the desired code word length, the starting code word length corresponding to a subset of the set of available code word lengths;
determining a number of shorten bits to be shortened from an information portion of the starting code word length, and a number of puncture bits to be punctured from the starting code word length, responsive to the desired code rate and to a difference in code word length between the desired code word length and the starting code word length;
selecting shortened code word bit positions of the starting code word and punctured code word bit positions of the starting code word, to produce a code word having the desired code word length and a number of information bits and a number of parity bits corresponding to the desired code rate; and
circuitry, coupled to the memory resource, for decoding the encoded code words according to low-density parity-check code and at the starting code word length, after inserting punctured and shortened bits into the encoded code words at the selected bit positions, to obtain code words at the starting code word length for decoding.

11. The apparatus of claim 10, wherein the decoding circuitry is for:
inserting a forced data state at the shortened code word bit positions in an information portion of an encoded code word;
inserting an initial data state at the punctured code word bit positions in the encoded code word; and
then decoding the encoded code word.

12. The apparatus of claim 10, further comprising:
circuitry for performing the selecting, determining, and selecting operations, and for storing data corresponding to the selected shortened and punctured code word bit positions in the memory resource.

13. The apparatus of claim 10, wherein the low-density parity check code corresponds to a block parity check matrix comprised of a plurality of submatrices arranged in block rows and block columns, and having an information portion and a parity portion, each of the block columns including a plurality of columns that each correspond to a bit position of the starting code word.

14. The apparatus of claim 13, wherein the shortened code word bit positions of the starting code word stored in the memory resource are selected by:
initializing a first index to an initial value;
for each of a plurality of block columns in the information portion of the block parity check matrix, selecting a bit position of the starting code word corresponding to the first index as one of the shortened code word bit positions;
stepping the first index; and
repeating the selecting and stepping steps to select the determined number of shorten bits.

15. The apparatus of claim 14, wherein the punctured code word bit positions of the starting code word are selected by:
initializing a second index to an initial value;
for each of a plurality of block columns, selecting a bit position of the starting code word corresponding to the second index as one of the punctured code word bit positions;
stepping the second index; and
repeating the selecting and stepping steps to select the determined number of puncture bits.

16. The apparatus of claim 15, wherein the initial value of the first index corresponds to the first column of a block column;
wherein the initial value of the second index corresponds to the last column of a block column;

wherein the step of stepping the first index comprises incrementing the first index; and and wherein the step of stepping the second index comprises decrementing the second index.

17. The apparatus of claim 14, wherein the shortened code word bit positions of the starting code word stored in the memory resource are selected by:

initializing a first index to an initial value;

initializing a block index to an initial value corresponding to a first block column of the block parity check matrix;

selecting an increment size value corresponding to the starting code word length;

selecting a bit position of the starting code word, in a block column corresponding to the block index, corresponding to the sum of the value of the first index and the value of the block index, as one of the shortened code word bit positions;

stepping the block index;

repeating the steps of selecting a bit position and stepping the block index for each of a plurality of block columns in the information portion of the block parity check matrix;

stepping the first index by the increment size value, and resetting the block index to the initial value; and repeating the selecting, stepping, and repeating steps to select the determined number of shorten bits.

18. The apparatus of claim 17, wherein the punctured code word bit positions of the starting code word are selected by:

initializing a second index to an initial value, different from the initial value of the first index;

initializing the block index to the initial value corresponding to a first block column of the block parity check matrix;

selecting a bit position of the starting code word, in a block column corresponding to the block index, corresponding to the sum of the value of the second index and the value of the block index, as one of the punctured code word bit positions;

stepping the block index;

repeating the steps of selecting a bit position and stepping the block index for each of a plurality of block columns of the block parity check matrix;

stepping the second index by the increment size value, and resetting the block index to the initial value; and repeating the selecting, stepping, and repeating steps to select the determined number of puncture bits.

* * * * *

UNITED STATES PATENT AND TRADEMARK OFFICE
CERTIFICATE OF CORRECTION

| | |
|---|---|
| PATENT NO. | : 7,581,159 B2 |
| APPLICATION NO. | : 11/284929 |
| DATED | : August 25, 2009 |
| INVENTOR(S) | : Dale E. Hocevar |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 946 days.

Signed and Sealed this

Fourteenth Day of September, 2010

David J. Kappos
*Director of the United States Patent and Trademark Office*